United States Patent
Becker et al.

(10) Patent No.: US 6,899,817 B1
(45) Date of Patent: May 31, 2005

(54) DEVICE AND METHOD FOR ETCHING A SUBSTRATE USING AN INDUCTIVELY COUPLED PLASMA

(75) Inventors: Volker Becker, Marxzell (DE); Franz Laermer, Stuttgart (DE); Andrea Schilp, Schwaebisch Gmuend (DE)

(73) Assignee: Robert Bosch GmbH, Stuttgart (DE)

( * ) Notice: Subject to any disclaimer, the term of this patent is extended or adjusted under 35 U.S.C. 154(b) by 42 days.

(21) Appl. No.: 10/031,842

(22) PCT Filed: Jun. 6, 2000

(86) PCT No.: PCT/DE00/01836

§ 371 (c)(1),
(2), (4) Date: Jun. 10, 2002

(87) PCT Pub. No.: WO01/06540

PCT Pub. Date: Jan. 25, 2001

(30) Foreign Application Priority Data

Jul. 20, 1999 (DE) .......................... 199 33 841

(51) Int. Cl.⁷ ........................... H01L 21/00; B44C 1/22
(52) U.S. Cl. ............................. 216/70; 216/67; 216/68; 438/706; 438/707; 156/345.48; 156/345.49
(58) Field of Search .............................. 216/67, 68, 70; 156/345.48, 345.49; 438/706, 707, 719

(56) References Cited

U.S. PATENT DOCUMENTS

| 5,648,701 A | 7/1997 | Hooke et al. |
| 5,997,687 A | 12/1999 | Koshimizu |
| 6,189,484 B1 * | 2/2001 | Yin et al. ................. 118/723 I |
| 6,247,425 B1 * | 6/2001 | Lymberopoulos et al. .. 118/723 I |
| 6,720,273 B1 | 4/2004 | Becker et al. .............. 438/723 |

FOREIGN PATENT DOCUMENTS

| DE | 42 41 045 | 5/1994 |
| DE | 197 34 278 | 2/1999 |
| DE | 199 18 392 | 11/1999 |
| DE | 199 00 179 | 2/2000 |
| DE | 199 19 832 | 11/2000 |
| DE | 199 27 806 | 1/2001 |
| EP | 0 849 766 | 6/1998 |
| JP | 10-64696 | 3/1998 |
| WO | WO 97/14177 | 4/1997 |
| WO | WO 99/50883 | 10/1999 |
| WO | WO 00/79579 | 12/2000 |

OTHER PUBLICATIONS

Patent Abstracts of Japan, vol. 1998, No. 08, Jun. 30, 1998.

* cited by examiner

*Primary Examiner*—Shamim Ahmed
(74) *Attorney, Agent, or Firm*—Kenyon & Kenyon (57) ABSTRACT

A method and a suitable device for carrying out this method is proposed, for etching a substrate (10), especially a silicon element, with the aid of an inductively coupled plasma (14). For this purpose, a high frequency electromagnetic alternating field is generated, which produces an inductively coupled plasma (14) from reactive particles in a reactor (15). In this connection, the inductively coupled plasma (14) comes about by the action of the high frequency electromagnetic alternating field upon a reactive gas. Furthermore, a device, in particular a magnetic field coil (21) is provided which produces a static or timewise varying magnetic field between the substrate (10) and the ICP source (13). For this, the magnetic field is oriented in such a way that its direction is at least approximately or predominantly parallel to the direction defined by the line connecting the substrate (10) and the inductively coupled plasma (14).

17 Claims, 3 Drawing Sheets

DEVICE AND METHOD FOR ETCHING A SUBSTRATE USING AN INDUCTIVELY COUPLED PLASMA

FIELD OF THE INVENTION

The present invention relates to a device and a method for etching a substrate, for example, a silicon element, by using an inductively coupled plasma.

BACKGROUND INFORMATION

In order to implement an anisotropic high rate etching method, for example, for silicon, using an inductive plasma source, it is necessary in one method, described, for example, in German Published Patent Application No. 42 41 045, to perform efficient sidewall passivation in as short a time as possible, during so-called passivating steps, and furthermore to achieve as high a concentration as possible of silicon-etching fluorine radicals during so-called etching steps. In order to achieve an etching rate that is as high as possible, it is conventional to work with as high as possible a high-frequency power at the inductive plasma source, and thereby to couple in as high as possible plasma powers into the generated inductively coupled plasma.

However, there are limits to these high-frequency powers, which result, on the one hand, from load capacity of the electrical components of the plasma source, but, on the other hand, are also of a process technology nature. Thus, high-frequency powers of an inductive plasma source reinforce harmful electrical intervention by the source region in the inductively coupled plasma generated, which deteriorate the etching results on the substrate wafer.

Also, in etching processes according to the kind described in German Published Patent Application No. 42 41 045, stability problems appear in the coupling in of the plasma in the changeover phases between etching and passivating steps. This is based on the fact that, in response to high power to be coupled in, in the kwatt range, power reflection and overvoltage appearing during the changeover phases can have a destructive effect on the electrical circuit of the plasma source (coil, connected capacitors, generator output stage).

On this point, German Published Patent Application No. 199 00 179 describes an inductive plasma source, further refined compared to the one described in German Published Patent Application No. 42 41 045, which, with the aid of a loss-free symmetrical high-frequency supply of the coil of the inductive plasma source, is suitable for especially high plasma powers, and generates an inductive plasma which is particularly poor in electrical interference induced voltages. But for this source type, there exists a practicable power limit of about 3 kwatt to 5 kwatt, above which the required high-frequency components become extremely expensive, or, with respect to plasma stability, problems take the upper hand.

A possible approach towards attaining higher etching rates within a manageable power scope is to raise the efficiency of the plasma generation. In this connection, using magnetic fields to raise plasma efficiency is conventional.

By applying a magnetic field to a plasma, as is conventional, the electron paths in the plasma are bent, and because of that the residence time of the electrons in the plasma is increased, i.e. the time until they reach a wall which absorbs the electrons, so that each electron can interact more often with surrounding gas atoms until it leaves the effective plasma excitation region. Such impact interactions between electrons and gas molecules lead to the desired ionization or dissociation of the gas molecules along with the release of radicals needed for the etching process.

According to the related art, a so-called "multipole confinement" includes a metallic, nonferromagnetic wall having a plurality of permanent magnets of alternating polarity, which reflects electrons from the wall outfitted with these magnets by the action of magnetic fields. Thereby, a higher electron density can be generated within this "multipole confinement". An analogous RIE (reactive ion etching) source is marketed, for example, by TEGAL Corporation, Petaluma Calif. 94955-6020, USA, as a so-called "HRe⁻ Source".

Other conventional plasma source types further make use of a magnetic field having a field direction parallel to a substrate electrode. Thus, by using a kind of Helmholtz coil pair directly at the-substrate electrode, a field distribution is generated that is as homogeneous as possible, which leads to increased length of the electron paths, and thereby to the generation of greater plasma densities. For the further homogenization of the effects, this horizontally oriented magnetic field as, for example, in the MRIE (magnetically enhanced reactive ion etching) equipment of Allied Materials, Inc., Santa Clara Calif. 95054-3299, USA, can further be rotated slowly in a planar manner.

In the case of so-called ECR (electron cyclotron resonance) sources, it is conventional that one should tune a longitudinal magnetic field in such a way that the circulation frequency of the electrons in this magnetic field, the so-called cyclotron frequency, is resonant with the frequency of the coupled-in microwave radiation, at least in a certain volume range of the etching reactor. Thus, an especially efficient plasma excitation by microwave irradiation can occur at a sufficiently free path length of the electrons, which opens up to such ECR sources the low-pressure range of process pressures lower than 1 $\mu$bar as a field of application. In this connection, the low pressure is a necessary condition for a sufficiently great path length of the electrons and for efficient plasma excitation. At higher pressures, ECR sources rapidly become inefficient, and go over to an unwanted thermal plasma generation. The advantage of the magnetic inclusion and the resonant excitation are thereby lost to a considerable extent.

It follows from the formula for the cyclotron frequency $\omega=eB/m$ that $B=m\omega/e$, i.e., at the usually irradiated microwave frequency of 2.45 GHz the magnetic field strength required for cyclotron resonance is 87.6 mTesla.

This application is not simply transferable to the case of high-frequency excitation in the MHz range, i.e., the case of typical frequencies for ICP (inductively coupled plasma) sources, since the free path lengths of the electrons, required for this, assume extremely low, impracticable pressures. After all, an inductive plasma source for high rate etching methods has to be configured for a relatively high pressure range of approximately 30 to 100 $\mu$bar.

The usual high frequency of 13.56 MHz, used for inductive plasma excitation using ICP sources, would further, in the case of cyclotron resonance, imply a resonance field strength of only 0.5 mT. However, such a low field hardly has any remaining guidance function for the electrons. For a sufficient guidance function, i.e., suppression of wall losses of the electrons in an extended plasma volume, field strengths of 10 mTesla or rather several times 10 mTesla to 100 mTesla are required.

Magnetic coils in an ECR-type configuration are also usually placed above, or at the same height as the plasma source, so as to generate the greatest field strength directly at the location of plasma generation, and so as to have the greatest possible influence on the plasma generating mechanism there. In the direction of the substrate to be etched, then, the magnetic field strength decreases rapidly because of the divergence of the magnetic field, so that the guidance function of the magnetic field is no longer sufficiently present in such an arrangement.

Varying plasma power coupled in an inductively coupled plasma having a high-frequency electromagnetic alternating field, adiabatically, between individual method steps, especially alternating etching and passivating steps, is described in German Published Patent Application No. 199 19 832. Such an adiabatic power transition, i.e., a gradual running-up or lowering of the coupled-in plasma power along with simultaneous continuous matching of the impedance of the ICP source to the respective plasma impedance as a function of the coupled-in plasma power, with the aid of an automatic matching network or an impedance transformer ("matchbox"), makes it possible to control the explained problems with regard to power reflection and voltage magnification in response to switching on and off plasma powers in the range of 1 kwatt to 5 kwatt. However, in this connection, a typical duration of transient effects is in the range of 0.1 sec to 2 sec. Therefore, power changes cannot be made by this approach.

SUMMARY

Compared to the related art, the device according to the present invention has the advantage that it makes available a plasma etching equipment having inductive plasma generation or a plasma inductively coupled via an ICP source, in which an additional constant magnetic field, or one varying with time, considerably increases the efficiency of plasma generation. In this connection, the inductively coupled plasma generated, starting from the plasma source, is guided through the generated magnetic field in a kind of magnetic bottle to a substrate to be etched. For this purpose, a magnetic field coil or a sufficiently strong permanent magnet having longitudinal field direction is placed between the inductive plasma source (ICP source) and the substrate or a substrate electrode carrying the substrate, such as a silicon wafer.

Thus, when performing the method according to the present invention, this device effects a very efficient plasma generation in the area of inductive excitation, and a low-loss plasma transport right up to the substrate to be etched. At the same time, decoupling of plasma generation and the generation of the magnetic field is achieved. Because of the symmetry of the configuration of the device according to the present invention, despite the nonhomogeneous field distribution of the magnetic coil, good uniformity on the substrate surface may be maintained.

Thus, by using the generated longitudinal magnetic field, i.e., a magnetic field the direction of which is at least approximately or predominantly parallel to the direction defined by the connecting line from the substrate to the inductively coupled plasma, the high-frequency power at the ICP source, required for high rate etching at the highest etching rates, is thus reduced by efficient utilization of the coupled-in high-frequency power for generating the desired plasma species (electrons, ions, free radicals). Because of this, higher etching rates are possible at equal plasma power.

Because the generation of the longitudinal magnetic field is placed between the ICP source and the substrate, both the substrate and the area of plasma generation in the reactor are arranged in a region of relatively high magnetic field strengths, and, thus, of good guidance of the electrons and ultimately also the ions.

In addition, electrical interference effects from the source region may be effectively reduced by the improvement, achieved with the device according to the present invention, of the economics of the ICP source and the possibility, that goes with it, of reducing power without reducing the etching rate, or with an etching rate increase at equal plasma power. Therefore, the etching result is achieved more economically.

Furthermore, a power that is constant, pulsed or generally varying with time may be made available considerably more cost-effectively than a greater high-frequency power for coupling in the plasma. This power demonstrates no harmful effect on the etching process or components of the plasma etching equipment.

Thus, the device according to the present invention may include an aperture positioned concentrically with the inner wall of the reactor, which may be arranged approximately 5 cm above the substrate positioned on a substrate electrode. Such an aperture construction is described, for example in German Published Patent Application No. 197 34 278.

The plasma etching equipment according to the present invention may also be furnished with a balanced, symmetrically configured and symmetrically supplied configuration of the ICP source, as described in German Published Patent Application No. 199 00 179.

A magnetic field coil having an appertaining current supply unit may be suitable for generating the magnetic field, since with that, the generated magnetic field is timely, and, with regard to its strength, is variable and, in particular, pulsable.

An ICP coil generator may be provided, which generates a variably adjustable, especially periodically varying or pulsed high-frequency power, which may be coupled into the inductively coupled plasma as plasma power.

Components may be integrated into the ICP coil generator which perform a variation of the frequency of the generated electromagnetic alternating field, for adapting the impedance as a function of the plasma power to be coupled in. An automatically acting feedback circuit having a frequency-selective component along the lines of a Meissner oscillator may be suitable for this.

The pulsing of the generated magnetic field may be correlated in time or synchronized with the pulsing of the coupled-in plasma power and/or the pulsing of the high-frequency power coupled into the substrate via the substrate voltage generator.

DETAILED DESCRIPTION

Figure 1:
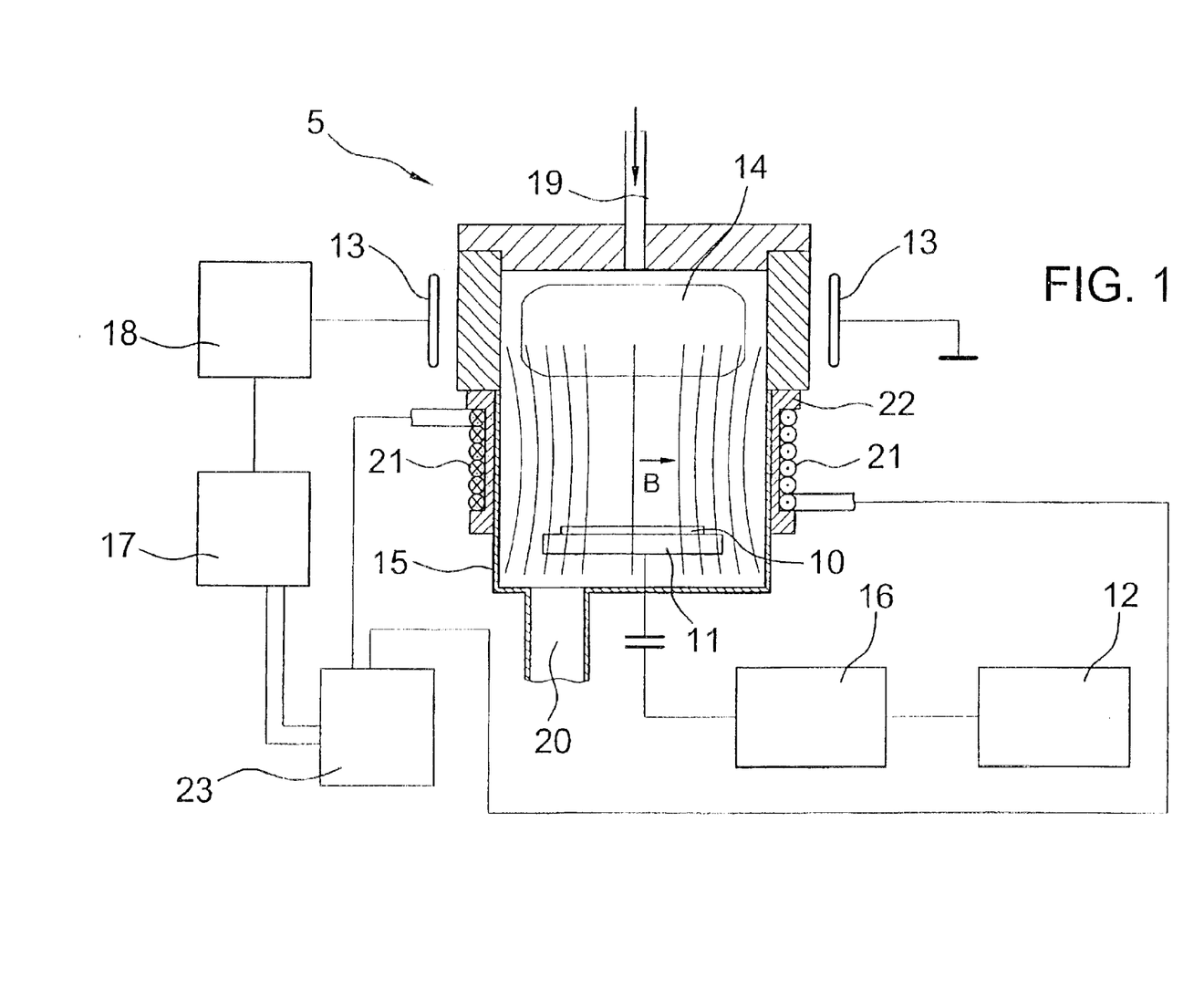
FIG. 1 is a schematic view of a plasma etching equipment.

FIG. 1 illustrates a first example embodiment of the present invention. A plasma etching equipment 5 includes a reactor 15, in the upper region of which an inductively coupled plasma 14 is generated in a conventional manner via an ICP (inductively coupled plasma) source 13. The following are also provided here: a gas feed 19 for supplying a reactive gas such as $SF_6$, $ClF_3$, $O_2$, $C_4F_8$, $C_3F_6$, $SiF_4$ or $NF_3$, a gas discharge 20 for removing reaction products, a substrate 10 such as a silicon body or a silicon wafer to be structured by the etching method according to the present invention, a substrate electrode 11 which is in contact with substrate 10, a substrate voltage generator 12, and a first impedance transformer 16. Substrate voltage generator 12 also couples in a high-frequency alternating voltage or high-frequency power into substrate electrode 11 and above that into substrate 10, causing acceleration of ions generated in inductively coupled plasma 14 onto substrate 10. The high-frequency power or alternating voltage input in this manner is typically between 3 watts and 50 watts and 5 volts and 100 volts in continuous operation and in pulsed operation respectively, each averaged over time over the pulse sequence.

In addition, an ICP coil generator 17 is also provided, which is connected to a second impedance transformer 18, and above that with ICP source 13. Thus, ICP source 13 generates a high-frequency electromagnetic alternating field and also an inductively coupled plasma 14 composed of reactive particles and electrically charged particles (ions) formed by the action of the high-frequency electromagnetic alternating field on the reactive gas in reactor 15. ICP source 13 includes a coil for this having at least one winding.

Figure 2:
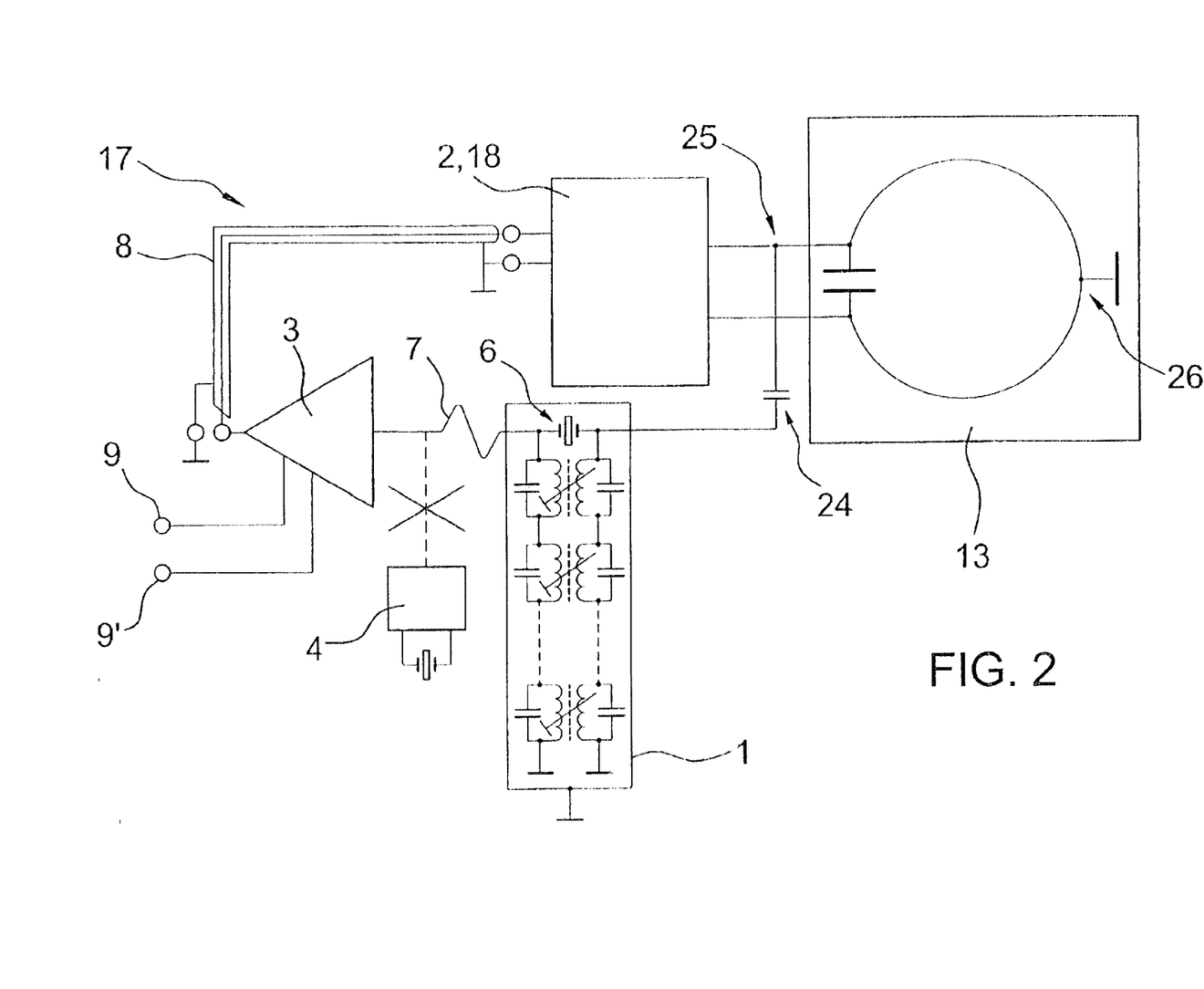
FIG. 2 is a schematic view of an electronic feedback circuit having a connected ICP source.

Second impedance transformer 18 may be configured in the manner described in German Published Patent Application No. 199 00 179, so that a balanced symmetrical arranged configuration and supply of ICP source 13 over ICP coil generator 17 are obtained. This guarantees that the high-frequency alternating voltages applied to the two ends of the coil of ICP source 13 are at least approximately in phase opposition to each other. Furthermore, the center tap of the coil of the ICP source may be grounded, as illustrated in FIG. 2.

The anisotropic high-rate etching process for silicon, having alternating etching and passivating steps, described in German Published Patent Application No. 42 41 045, is further performed, for example, using plasma etching equipment 5. With respect to further details, known to one skilled in the art, concerning plasma etching equipment 5, as described up to this point as being known from the related art, and the etching method performed with it, especially with respect to the reactive gases, the process pressures and the substrate electrode voltages in each respective etching step or passivating step, as the case may be, reference may be made to German Published Patent Application No. 42 41 045.

Plasma etching equipment 5 is also suitable for supervisory control, as described in German Published Patent Application No. 199 27 806.

During the etching of substrate 10, for example, during the passivating steps in reactor 15, passivating is performed, for example, at a process pressure of 5 μbar to 20 μbar, and a plasma power, coupled into plasma 14 via ICP source 13, of 300 to 1000 Watt. $C_4F_8$ or $C_3F_6$, for example, are suitable as passivating gases. During the subsequent etching steps, etching is performed, for example, at a process pressure of 30 μbar to 50 μbar and a high plasma power of 1000 to 5000 Watt. $SF_6$ or $ClF_3$, for example, are suitable as reactive gas.

An example embodiment of the plasma etching equipment further provides that, to improve the selectivity of an etching base polymer removal relative to the sidewall film removal, the ion acceleration voltage applied to the substrate by substrate voltage generator 12 be switched back by reduction of the coupled-in plasma power in the etching steps, each time after breakthrough of the initial etching base polymer, as described in German Published Patent Application No. 199 19 832 and explained in detail.

This switching back here occurs in a conventional manner, either abruptly or continuously via a time-related ramp function. This achieves a further improvement of the silicon etching rate, of the selectivity of the etching process with respect to a masking material, of the profile accuracy and, for example, of the suppression of pockets in a dielectric etch-stop layer.

In addition, according to the present invention, a so-called "spacer" is further placed as spacer 22, made of a nonferromagnetic material such as aluminum, between inductively coupled plasma 14 or ICP source 13, i.e., the actual plasma excitation zone, and substrate 10. This spacer 22 is concentrically set into the wall of reactor 15 as a spacer ring, and thus forms the reactor wall, from place to place. It includes a typical height of approximately 5 mm to 30 mm at a typical diameter of reactor 15 of 30 to 100 cm.

Spacer 22 further surrounds a magnetic field coil 21, which has, for instance, 100 to 300 turns and is wound with a lacquered copper wire of a sufficient gauge for the strength of current to be used. Additionally, copper pipes may be accommodated in magnetic field coil 21, having cooling water flowing through them so as to remove heat losses from magnetic field coil 21.

Alternatively, it is also possible to wind magnetic field coil 21 itself from a thin copper pipe lacquered with an electrically insulating material, and having the cooling water flowing through it directly.

An electric current such as 10 to 100 amp is conducted through magnetic field coil 21 via a current supply unit 23. In the example embodiment, this is, for example, a d.c. current which generates a static magnetic field on the inside of reactor 15, which, in the case of a magnetic field coil 21 having 100 turns and a length of 11 cm as well as a diameter of 40 cm generates a magnetic field strength in the center of magnetic field coil 21 of about 0.3 mTesla/A of current flow.

For a significant increase of plasma generating efficiency and sufficient magnetic guidance of inductively coupled plasma 14, 10 mT to 100 mT, for example 30 mT, are required, as explained above. That means, current supply unit 23 makes available current strengths of about 30 to 100 amp during etching of a substrate 10, using plasma etching equipment 5.

Instead of magnetic field coil 21, a permanent magnet may be used. Such a permanent magnet may require no energy, but may have the disadvantage that setting the magnetic field strength, which is of advantage for setting an optimum etching process, is not possible. Furthermore, the field strength of a permanent magnet is temperature dependent, so that magnetic field coil 21 may be preferred.

It is important in each case that the direction of the magnetic field generated by magnetic field coil 21 or by the permanent magnet is at least-approximately or predominantly parallel to the direction defined by the connecting line of substrate 10 and inductively coupled plasma 14 or the plasma generating zone (longitudinal magnetic field orientation).

A refinement of the explained example embodiment further provides for installing an aperture described in German Published Patent Application No. 197 34 278, for improvement of the uniformity of the etching process. For reasons of clarity, this aperture is omitted in FIG. 1. It is mounted on the inside of reactor 15, concentrically with the reactor wall, between ICP source 13 or the plasma excitation zone and substrate 10. It may be fastened on spacer 22, approximately 5 cm above substrate electrode 11 or substrate 10.

Also, in case of the use of a magnetic field coil 21, a suitable monitoring device may be integrated into current supply unit 23, the monitoring device being integrated into the process sequence control, and performing a monitoring of the coil temperature and emergency switching-off, for example, when there is a shortage of cooling water.

In the first example embodiment, during etching, ICP coil generator 17 couples continuously during the etching steps or passivating steps an at least to a great extent constant plasma power of a minimum of 300 Watt to a maximum of 5000 Watt into inductively coupled plasma 14.

During the passivating steps, a plasma power of 500 Watt, for example, is coupled into inductively coupled plasma 14, and during the etching steps a plasma power of 2000 Watt, for example, is coupled into inductively coupled plasma 14. ICP coil generator and second impedance transformer 18, in the manner described in German Published 199 19 832 and explained above, in response to a transition from a passivating to an etching step, performing an adiabatic up-regulating of the coupled-in plasma power over a time-related ramp function and, at the same-time, via second impedance transformer 18, performing an automatic, stepwise or continuous impedance adaptation.

A second example embodiment of the present invention provides that, as a modification of the first example embodiment, instead of adiabatic control of the high-frequency power coupled into the inductively coupled plasma 14 by IPC source 13, and instead of a matching of the coupled-in high-frequency power given at any point in time, via the automatic matching network ("matchbox") as the second impedance transformer 18, to the plasma impedance changing with increasing plasma power, alternatively the previously constant frequency of the high-frequency electromagnetic alternating field, which ICP coil generator 17 produces., may be varied for impedance matching.

The matchbox, which may be symmetrically configured and may supply ICP source 13 symmetrically in second impedance transformer 18 may be, in this connection, set in such a way that it ensures an optimum impedance matching in the steady-state power case. This steady-state power case is characterized in that, in this connection, the plasma power inductively coupled into plasma 14 has reached a high maximum or final value such as 3000 watt to 5000 watt, a steady-state frequency or a resonant frequency 1'' of, for example, 13.56 MHz of the frequency produced by ICP coil generator 17 of the high-frequency electromagnetic alternating field having simultaneously been reached.

The steady-state frequency 1' of conventional ICP coil generators 17 is generally 13.56 MHz, besides this standard, generators having other frequencies or frequency ranges may also be commercially obtainable. However, in such ICP coil generators 17, in deviation from the realization according to the present invention, the steady-state frequency 1'' is set to a fixed value which is, for example, derived with great accuracy from the natural frequency of a quartz-crystal oscillator. Thus, during a power change, for example, during the run-up of the plasma power to be coupled into plasma 14 from, for instance 500 watt to 3000 watt at a steady frequency of the high-frequency of high-frequency alternating field generated by ICP coil generator 17, with a predefined setting of impedance transformer 18, no matching, or only a poor one, to the plasma impedance changing as a function of the plasma power is possible, so that high reflected powers appear during the transients. However, if the frequency of ICP coil generator 17 is enabled in such phases, then by a change in the frequency of the high-frequency electromagnetic alternating field, a substantially optimum impedance adaptation, even under quickly changing plasma conditions, may be maintained.

An advantage of the production of the correct impedance matching via a variable frequency of the high-frequency power of coil generator 17 is that this frequency change may be performed very fast because it is limited only by the control rate of the corresponding electronic circuit. That makes possible reaction times in the microsecond range, without any problem.

In contrast, manual or automatic setting of an matching network requires the change of mechanical quantities in second impedance transformer 18, for example, the resetting of variable capacitors by motors, which occurs correspondingly slowly. Typical time constants here lie in the range of tenths of seconds.

According to the second example embodiment, a control circuit integrated in second impedance transformer 18, for example, in a conventional manner, detects the instantaneous control error, i.e., the faulty adaptation of the impedance of the output of ICP coil generator 17 and the impedance of ICP source 13, with respect to amplitude and phase. This may occur by a measurement of the signal reflected at ICP source 13 or second impedance transformer 18, using reflectometers sufficiently conventional in high-frequency technology, amplitude and phase errors being detected.

From this information, a corresponding frequency change of the electromagnetic alternating field at ICP coil generator 17, required in each case, is ascertained, for example, continuously within a predefined frequency range, so that the control errors with respect to amplitude and phase may be minimized. This basically only corrects an amplitude error, since, as is conventional, to a great extent only the real plasma resistance changes as a function of the coupled in plasma power, and the phase relationship of the impedances is set correctly, at least roughly, just by the explained presetting of second impedance transformer 18.

When the output power of ICP coil generator 17, and with that also the plasma impedance finally become steady-state after completion of the run-up of the plasma power, the control circuit takes the frequency of ICP coil generator 17, or of the electromagnetic alternating field generated, back to the actually desired fixed value such as 13.56 MHz, and fixes it there. In this connection, for the frequency in the case of the steady-state power, second impedance transformer 18 is set correctly via the presetting ascertained before, which is a function of the maximum plasma power to be reached, and this can may be done either manually or automatically, using low-speed control characteristics.

To sum up, if the frequency of ICP coil generator 17 is thus fixed, in the steady-state case of the power to be coupled in, at, for example, 13.56 MHz, whereas, during the course of the unstable run-up phases of the generator output power, the frequency is temporarily released within a certain bandwidth, and is controlled by an electronic control system for impedance matching. Thus, it is possible to perform even very fast power-changes of-the-generator output power in the range of microseconds in a stable manner, at simultaneous high power changes, which is not possible using known matching networks or impedance transformers.

Figure 3:
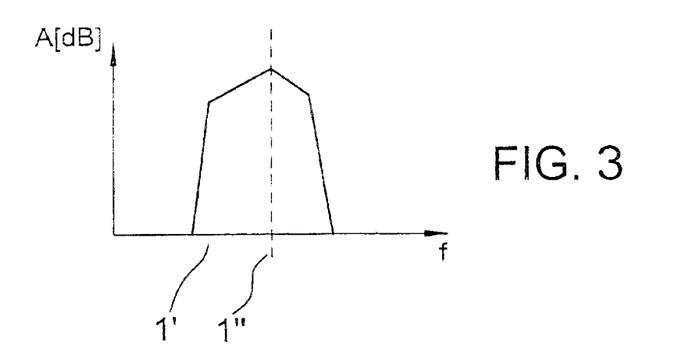
FIG. 3 illustrates an example of a filter characteristic curve.

This is explained, for example, with the aid of FIG. 3, in which a filter characteristic line 1' is illustrated, which illustrates a preset frequency range within which the frequency of ICP coil generator 17 may be varied, each frequency being assigned a certain high-frequency power or plasma power to be coupled in, or a coupling loss A of the power of ICP coil generator 17. The frequency to be reached in the case of steady-state power, in this connection, is the steady-state frequency 1", which may be 13.56 MHz, for example, and at which the predefined maximum power is supplied as the plasma power to inductively coupled plasma 14.

A third example embodiment of the present invention, in continuation of the second example embodiment explained above, further provides leaving the frequency variation of ICP coil generator 17 to an automatically acting feedback circuit, so that one may do without measuring the faulty adaptation in each case or measuring the reflected signals, for example, by reflectometer. This is explained in more detail with the aid of FIG. 2.

In this connection, ICP source 13, i.e., its coil, to be exact, in a conventional manner as described in German Published Patent Application No. 199 00 179, is first energized by a, for example, balanced symmetrical matching network 2 from an unbalanced unsymmetrical output of ICP coil generator 17. Adaptation network 2 is a part of second impedance transformer 18.

The ICP coil generator 17 is further, in this case, made similar to a widespread specific embodiment, including a high-frequency power element 3 and a quartz oscillator 4 for producing a high-frequency fundamental wave having a fixed frequency such as 13.56 MHz.

Conventionally, the high-frequency fundamental wave of quartz oscillator 4 is normally supplied to the amplifying input of power element 3. According to the present invention, however, this supply is modified in such a way that quartz oscillator 4 is made accessible separately from the amplifier input of power element 3, and its input is made accessible externally, for example, via a corresponding input socket. Since the quartz oscillator in this specific embodiment no longer provides a function, it may be suitably deactivated.

Power element 3 further includes generator control inputs 9 in a convention manner, which are used for external control of ICP coil generator 17. Using them makes possible, for example, switching on and off ICP coil generator 17 or the stipulation of a high-frequency power to be generated. In addition, generator status outputs 9' are possible, for the feedback of generator data such as, for instance, generator status current output power, reflected power, overload, etc., to an external control unit (machine control), or to current supply unit 23 of plasma etching equipment 5.

The amplifier input of power element 3 is suitably connected to ICP source 13, in the sense of a feedback circuit via a frequency-selective component 1.

In this connection, additionally, capacitors, inductance coils and resistors or combinations of these may be interconnected and provided in a conventional manner as voltage dividers, in order to weaken the high voltages that appear at the coil of ICP source 13 to a suitable measure for frequency-selective component 1 or the amplifier input of power element 3. Such voltage dividers are conventional, and are indicated in FIG. 2 only by a decoupling capacitor 24 between the coil of ICP source 13 and frequency-selective component 1. Alternatively, one may also move signal tap 25 to the vicinity of the drawn-in grounded center point or center tap 26 of the coil of ICP source 13, where correspondingly lower voltage levels are present. Depending on the distance of the signal tap, which, for example, may be configured as an adjustable clip contact, from grounded center tap 26 of the coil of ICP source 13, a larger or smaller tapped voltage may be set, and thus favorable level ratios may be achieved.

Frequency-selective component 1 is represented in the example as a tunable arrangement of coils and capacitors, so-called LC resonant circuits, which together form a band-pass filter. This band-pass filter includes as conducting state region a certain predefined bandwidth such as 0.1 MHz to 4 MHz, and a filter characteristic line 1', as illustrated as an example in FIG. 3.

The band-pass filter has a resonance or steady-state frequency 1" having maximum signal transmission. This steady-state frequency 1" may be 13.56 MHz, for example, and may be fixed exactly, for example, by a quartz-crystal oscillator 6 or a piezoceramic filter element as additional components of the band-pass filter.

Alternatively, it is also possible, instead of LC resonant circuits, to combine so-called piezoceramic filter elements, or other conventional frequency-selective components into a band-pass filter having the desired filter characteristic line, bandwidth and steady-state frequency 1".

The arrangement described above controlled power element 3, matching network 2, ICP source 13 and band-pass filter represents in total a feedback circuit of the same kind as a Meissner oscillator.

During operation, this first begins to oscillate in the neighborhood of steady-state frequency 1", in order to build up to a predefined output power of power element 3. The phase relationship, required for the build-up, between generator output and signal tap 25 is set correctly for this purpose once, in advance, for example, via a delay line 7 of specific length, and with that, via the phase shift defined by the signal propagation time or a phase shifter instead of delay line 7. This ensures that the coil of ICP source 13 has damping reduced with a correct phase.

Via delay line 7 it is further ensured that, at the location of ICP source 13, the driving electrical voltage and the current in the coil of ICP source 13 have a resonance phase of approximately 90° to each other.

In practice, the resonance condition of the feedback circuit with regard to frequency-selective component 1 is not severe, so that, in general, a small frequency shift in the neighborhood of resonance or steady-state frequency 1" is sufficient for almost automatically correcting the resonance condition with respect to the phase. Therefore, it is sufficient to correct the resonance condition only approximately by the outer circuit elements, so that the resonant circuit builds up somewhere close to its steady-state frequency 1".

However, if all phase shifts from signal tap 25 of the coil of ICP source 13 via the band-pass filter into the input of power element 3, and through the power element back to second impedance transformer 18 into the coil of ICP source 13 should sum up so unfavorably that actually dumping instead of damping reduction of the resonant circuit occurs, the system cannot begin to oscillate. The feedback then becomes an unwanted negative feedback instead of the desired positive feedback. The setting of this approximately correct phase is accomplished by delay line 7, the length of which should therefore be set at one time in such a way that the feedback acts constructively, i.e., to reduce damping.

Thus, in the case of faulty adaptation to the plasma impedance, for example, during rapid power changes, the explained feedback circuit may thus give way in its frequency within the band pass of the band-pass filter, and always maintain a largely optimum impedance matching, even during rapid impedance changes of inductively coupled plasma 14.

Then, as soon as inductively coupled plasma 14 stabilizes with regard to the plasma impedance or the coupled-in plasma power, the frequency of ICP coil generator 17 will return again to near or exactly the value of the maximum pass frequency, which is given by the resonant frequency or steady-state frequency 1". This matching of the impedance by frequency variation occurs automatically and very rapidly within a few periods of oscillation of the high-frequency voltage, i.e., in the microsecond range.

The connection between the output of power element 3 and the input of second impedance transformer 18 is made by line 8, which is configured as a coaxial cable, and is capable of carrying a power of a few kwatt.

With this automatically building-up arrangement, or even with the arrangement described above, having active frequency control for matching to rapidly changing plasma impedances, it is also possible to perform a pulsed operation of the inductive plasma source.

In the case of the refinement of the ICP coil generator described in the fourth example embodiment, it is further possible to perform a pulsed operation of ICP source 13, and thereby, for example, also to couple in pulsing plasma power during the etching or passivating steps of the etching method.

To do this, the output power of ICP coil generator 17, for example, is periodically switched on and off using a repetition frequency of typically 10 Hz to 1 MHz, such as 10 kHz to 100 kHz, i.e., it is pulsed, or the envelope curve of the output voltage of ICP coil generator 17 has its amplitude modulated by a suitable modulating voltage. Such devices for amplitude modulation conventional from high-frequency technology.

For example, generator control input 9 may be used to select the setpoint value of the high-frequency power of ICP coil generator 17 for the purpose of supplying the signal modulating the high-frequency power of ICP coil generator 17.

Since, in response to a pulsed operation of ICP source 13, very rapid impedance changes appear in plasma 14, it is conventionally impossible, especially with power in the kwatt range, to avoid the occurrence of high reflected power during switching on and off coupled-in high-frequency power pulses, or at least to make these harmless.

In contrast, by using the device explained in this example embodiment, the impedance matching of inductively coupled plasma 14, or ICP source 13, and ICP coil generator 17 is ensured at all times, in this case as well.

Compared to a continuous operation, a pulsed operation of ICP source 13 has the further advantage that, during the high-frequency power pulses or during the plasma power pulses a substantially higher plasma density may be achieved than in continuous operation. This is based on the fact that generation of an inductive plasma is a high-grade nonlinear process, so that the average plasma density in this pulsed operational mode is higher than in the case of an average plasma power corresponding to the time average.

Therefore, in pulse operation one effectively obtains more reactive species and ions with respect to the time average than in continuous operation. This is true when so-called "giant impulses" are used, i.e., relatively brief and extremely high-powered high-frequency power impulses such as 20 kwatt peak power, as is possible with the device according to the present invention, the average plasma power at time average being, for example, only 500 watt.

In this connection, unavoidable heat losses in ICP coil generator 17 and other equipment components of plasma etching equipment 5 are correlated with the relatively low time-averaged value of the plasma power, whereas desired plasma effects, particularly the achievable etching rates, may correlate with the occurring peak powers. As a result, the efficiency of generation of reactive species and ions is improved.

In this connection, ICP coil generator 17 and the remaining components of plasma etching equipment 5 involved may be configured in such a way that they may process even the occurring peak loads (peak currents and peak voltages) without damage. On account of the high voltage peaks at the inductive coil, the balanced supply of the ICP coil may have an advantageous effect on obtaining favorable plasma properties.

A further advantage of pulsed operation of ICP source 13 is that interfering electrical charges on substrate 10 to be etched may be discharged during the pauses between the high-frequency power pulses, and profile control during etching may thereby be improved in toto.

Typical pulse/pause ratios are between 1:1 and 1:100, the average plasma power typically being 100 watt to 1000 watt. The amplitude of the individual high-frequency power pulses effectively is between 500 watt and 20,000 watt, such as at approximately 10,000 watt.

In continuation of the fourth example embodiment, a fifth example embodiment additionally provides that first, as explained above, a pulsed inductively coupled plasma 14 is generated in an ICP source 13, using magnetic field support. In this connection, the magnetic field generated by magnetic field coil 21, which was always held constant at least to a great extent with respect to time, in the preceding example embodiments, is also pulsed.

This pulsing of the magnetic field, which is brought about in a simple manner by corresponding current pulses generated by current supply unit 23, may occur in such a way that the magnetic field is only generated if simultaneously also a high-frequency oscillation packet or a high-frequency power pulse for generating or coupling in plasma power into inductively coupled plasma 14 is present at ICP source 13. As long as no plasma power is coupled in or no plasma is excited, generally no magnetic field support may be required either.

Figure 4:
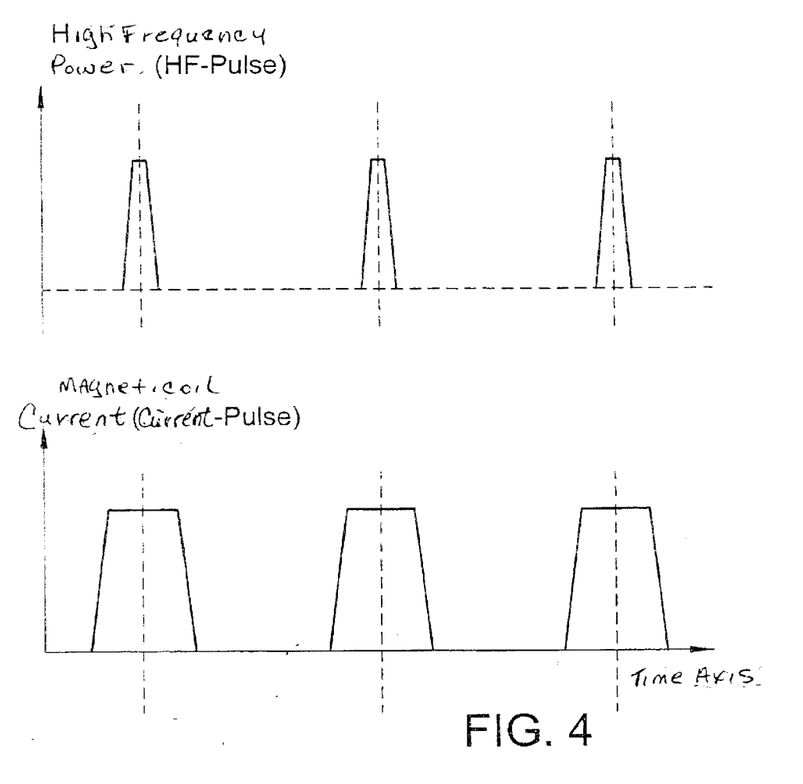
FIG. 4 illustrates an example of a correlation in time of high-frequency power pulses and magnetic field pulses.

A possible synchronization in time of high-frequency power pulses for coupling in plasma power in plasma 14 and current pulses through magnetic field coil 21 is explained, in this connection, with the aid of FIG. 4.

The coil current is switched on by magnetic field coil 21 in each case shortly before the application of a high-frequency oscillation packet, i.e., a high-frequency power pulse, and is switched off again after the end of this pulse.

Synchronization of current and high-frequency power pulses may be ensured in a simple manner, in this connection, by a conventional impulse generator, integrated into current supply unit 23, for example, which is furnished with additional time elements, in order to connect to the supply the high-frequency power pulse with a certain delay of, for example, 10% of the set high-frequency impulse duration after switching on the current of magnetic field coil 21, or to switch this current off again with a-certain-delay of, for example, 10% of the set high-frequency impulse duration after the end of the high-frequency power impulse. Such synchronization circuits and corresponding time elements for generating the needed time delays are conventional. For this, current supply unit 23 is further in connection with ICP coil generator 17.

Synchronization of the pulsing of magnetic field and coupled-in plasma power may reduce the ohmic heat losses arising in magnetic field coil 21. Thereby the problems of cooling and temperature control are deactivated.

If, for example, the coupled-in plasma power is operated with a pulse/pause ratio of 1:20, the current may also be pulsed by the magnetic field coil at, for example, a pulse/pause ratio of 1:18. In this connection, the duration of a current impulse by magnetic field coil 21 is always a little longer than the duration of a high-frequency power pulse.

By this procedure, heat removal of magnetic field coil 21 may be reduced, for example, to 1/18 of the original value. Use of electrical energy is correspondingly reduced.

Typical rates of repetition or pulse rates are oriented to the inductance of magnetic field coil 21, which limits the speed of change of the coil current. A rate of repetition of a few 10 Hz to 10 kHz is realistic for most magnetic field coils 21, depending on their geometry. Typical pulse/pause ratios for the high-frequency power pulses are between 1:1 and 1:100.

In this connection, the aperture may be applied as described in German Published Patent Application No. 197 34 278 and already explained, below magnetic field coil 21, a few cm above substrate 10 or substrate electrode 11, which carries substrate 10.

The use of this aperture improves, on the one hand, uniformity of the etching over the substrate surface, especially clearly with a symmetrically supplied ICP source 13. At the same time, the time-variable magnetic field—the transients—is also reduced at the location of substrate 10. In this connection, eddy currents in the aperture ring of the aperture lead to a dumping of the time-variable magnetic field components directly before substrate 10, so that induction processes on substrate 10 itself are weakened.

Such changing magnetic fields, so-called transients, may induce voltages in antenna structures on the substrate, which on their part may again lead to damage to the substrate, if the latter, for example, includes integrated circuits or especially field effect transistors.

It is possible also to pulse the high-frequency power, present at substrate 10 via substrate electrode 11, which is generated by substrate voltage generator 12 for the acceleration of the ions. This pulsing may, for example, also be done correlated in time, or synchronized, with the pulsing of the magnetic field and/or the pulsing of the coupled-in plasma power.

What is claimed is:

1. A method for etching a substrate using a device having an inductively coupled plasma source configured to generate a high-frequency electromagnetic alternating field and a reactor configured to produce an inductively coupled plasma from reactive particles by the action of the high-frequency electromagnetic alternating field upon a reactive gas, comprising the step of:

producing a magnetic field, during the etching, a direction of which is at least one of approximately and predominantly parallel to a direction defined by a connecting line of the substrate and the inductively coupled plasma;

wherein the magnetic field is at least one of static, time-wise varying, periodically varying and pulsed and extends into a region of the substrate and the inductively coupled plasma, and wherein a variably adjustable high-frequency power is produced, is coupled as plasma power into the inductively coupled plasma, and is at least one of periodically varied and pulsed.

2. The method according to claim 1, wherein the substrate includes a silicon element.

3. The method according to claim 1, wherein the magnetic field is produced in the producing step using an amplitude of a field strength between 10 mTesla and 100 mTesla on an inside of the reactor.

4. The method according to claim 1, wherein the inductively coupled plasma is produced with a high-frequency electromagnetic alternating field having a frequency that is one of constant and varying within a frequency range about a steady-state frequency.

5. The method according to claim 4, wherein the steady-state frequency is 13.56 MHz.

6. The method according to claim 1, wherein the etching is performed in alternating etching and passivating steps.

7. The method according to claim 1, wherein the etching is performed at a process pressure of 5 $\mu$bar to 100 $\mu$bar and a coupled-in average plasma power of 300 watt to 5000 watt.

8. The method according to claim 1, wherein a pulsed magnetic field is produced, via a current supply unit, an amplitude of field strength of which, on an inside of the reactor, is between 10 mTesla and 100 mTesla.

9. The method according to claim 8, wherein the magnetic field is pulsed at a frequency of 10 Hz to 20 kHz, and a pulse/pause ratio of 1:1 to 1:100 is set.

10. The method according to claim 1, further comprising the step of operating an inductively coupled plasma coil generator having a frequency of 10 Hz to 1 MHz in a pulsed fashion to produce the plasma power, an average plasma power of 300 watt to 5000 watt coupled into the inductively coupled plasma.

11. The method according to claim 10, wherein the inductively coupled plasma coil generator is operated using a pulse/pause ratio of 1:1 to 1:100.

12. The method according to claim 1, wherein the pulsing of the coupled-in plasma power is accompanied by a change in frequency of the coupled-in high-frequency power.

13. The method according to claim 12, further comprising the step of controlling the frequency change to maximize the plasma power coupled into the inductively coupled plasma during pulsing.

14. The method according to claim 12, wherein the inductively coupled plasma coil generator is operated in the form of an automatically acting feedback circuit, and a frequency of the high-frequency power produced, which forms the coupled-in high-frequency electromagnetic alternating field, is varied about the steady-state frequency.

15. The method according to claim 1, wherein the pulsing of the magnetic field is one of correlated in time and synchronized with the pulsing of at least one of the coupled-in plasma power and the high-frequency power coupled into the substrate via the substrate voltage generator.

16. The method according to claim 15, wherein the synchronization is performed so that the magnetic field is first applied before a high-frequency power pulse of the inductively coupled plasma coil generator for the coupling of the plasma power into the inductively coupled plasma, and the magnetic field is only switched off again after the high-frequency power pulse has faded out.

17. The method according to claim 15, wherein a pulse/pause ratio of the magnetic field pulses is greater than a pulse/pause ratio of the high-frequency power pulses, and the magnetic field is held at least approximately constant during the high-frequency power pulses.

* * * * *

UNITED STATES PATENT AND TRADEMARK OFFICE
CERTIFICATE OF CORRECTION

PATENT NO.        : 6,899,817 B1
APPLICATION NO. : 10/031842
DATED             : May 31, 2005
INVENTOR(S)       : Volker Becker et al.

It is certified that error appears in the above-identified patent and that said Letters Patent is hereby corrected as shown below:

On the Title Page, # (57) Abstract, line 1, change "A method and a suitable device for carrying out this method" to --A method and a device is for--

On the Title Page, # (57) Abstract, line 2, delete " is proposed, for"

On the Title Page, # (57) Abstract, line 2, change "a substrate (18), especially a silicon" to --a substrate, e.g., a silicon--

On the Title Page, # (57) Abstract, line 3, change "plasma (14)." to --plasma.--

On the Title, # (57) Abstract, line 6, delete "(14)"

On the Title, # (57) Abstract, line 6, change "a reactor (15)." to --a reactor.--

On the Title, # (57) Abstract, line 10, change "in particular" to --such as--

On the Title, # (57) Abstract, line 10, delete "(21)"

On the Title, # (57) Abstract, line 12, delete "(10)"

On the Title, # (57) Abstract, line 12, change "ICP source (13). For this" to --ICP source.--

On the Title, # (57) Abstract, line 13, change "the magnetic field" to --The magnetic field--

UNITED STATES PATENT AND TRADEMARK OFFICE
CERTIFICATE OF CORRECTION

PATENT NO. : 6,899,817 B1
APPLICATION NO. : 10/031842
DATED : May 31, 2005
INVENTOR(S) : Volker Becker et al.

It is certified that error appears in the above-identified patent and that said Letters Patent is hereby corrected as shown below:

On the Title, # (57) Abstract, line 15, delete "(10)"

On the Title, # (57) Abstract, line 16, change "plasma (14)." to --plasma.--

Signed and Sealed this

Twenty-sixth Day of September, 2006

JON W. DUDAS
*Director of the United States Patent and Trademark Office*